US012170110B2

(12) United States Patent
Dagan

(10) Patent No.: US 12,170,110 B2
(45) Date of Patent: Dec. 17, 2024

(54) SILICON-ON-INSULATOR (SOI) CIRCUITRY FOR LOW-VOLTAGE MEMORY BIT-LINE AND WORD-LINE DECODERS

(71) Applicant: Weebit Nano Ltd., Hod Hasharon (IL)

(72) Inventor: Lior Dagan, Ram-On (IL)

(73) Assignee: Weebit Nano Ltd., Hod Hasharon (IL)

(*) Notice: Subject to any disclaimer, the term of this patent is extended or adjusted under 35 U.S.C. 154(b) by 135 days.

(21) Appl. No.: 18/057,000

(22) Filed: Nov. 18, 2022

(65) Prior Publication Data

US 2023/0162789 A1 May 25, 2023

Related U.S. Application Data

(60) Provisional application No. 63/281,288, filed on Nov. 19, 2021.

(51) Int. Cl.
| | | |
|---|---|---|
| *G11C 13/00* | (2006.01) | |
| *G11C 7/12* | (2006.01) | |
| *G11C 8/08* | (2006.01) | |

(52) U.S. Cl.
CPC .......... *G11C 13/0026* (2013.01); *G11C 7/12* (2013.01); *G11C 8/08* (2013.01); *G11C 13/0028* (2013.01); *G11C 13/0038* (2013.01); *G11C 2213/53* (2013.01)

(58) Field of Classification Search
CPC ......... G11C 13/0026; G11C 7/12; G11C 8/08; G11C 13/0028; G11C 13/0038; G11C 2213/53; G11C 8/10
See application file for complete search history.

(56) References Cited

U.S. PATENT DOCUMENTS

| | | | |
|---|---|---|---|
| 4,899,317 A * | 2/1990 | Hoekstra | G11C 11/419 365/177 |
| 5,265,062 A | 11/1993 | Lee | |
| 6,044,012 A | 3/2000 | Rao et al. | |
| 6,055,205 A | 4/2000 | Rao et al. | |
| 6,177,830 B1 | 1/2001 | Rao | |
| 6,683,805 B2 | 1/2004 | Joshi et al. | |

(Continued)

OTHER PUBLICATIONS

Lin, C-H et al. "High performance 14nm SOI FinFET CMOS technology with 0.0174μm2 embedded DRAM and 15 levels of Cu metallization," 2014 IEEE International Electron Devices Meeting, 2014, pp. 3.8.1-3.8.3, doi: 10.1109/IEDM.2014.7046977.

*Primary Examiner* — Ajay Ojha
(74) *Attorney, Agent, or Firm* — M&B IP Analysts, LLC

(57) ABSTRACT

A memory including a memory array having a plurality of bit-line inputs and a plurality of word-line inputs; a bit-line decoder; and a control circuit is provided. The bit-line decoder includes a first circuit and a second circuit including a plurality of low-voltage field effect transistors (FET). The control circuit provides control signals to the plurality of low-voltage FETs in a sequence of a pre-pulse phase, a pulse phase, and a post-pulse phase, wherein at the pulse phase, the first circuit and the second circuit receives a desired voltage. The control circuit provide control signals the plurality of low-voltage FETs a voltage no greater than a low-voltage at the pre-pulse phase and the post-pulse phase. In silicon-on-insulator (SOI) technologies, use of low-voltage FETs in the bit-line and word-line decoders reduces the area of the periphery circuits of the memory array without requiring change to the memory array itself.

18 Claims, 9 Drawing Sheets

(56) References Cited

U.S. PATENT DOCUMENTS

| | | |
|---|---|---|
| 6,798,688 B2 | 9/2004 | Joshi |
| 7,839,682 B2 | 11/2010 | Tran et al. |
| 8,837,252 B2 | 9/2014 | Bedarida et al. |
| 9,446,347 B2 | 9/2016 | Hasse et al. |
| 9,503,091 B2 | 11/2016 | Kirihata et al. |
| 9,570,155 B2 | 2/2017 | Braceras et al. |
| 9,679,655 B2 | 6/2017 | Polizzi et al. |
| 9,966,145 B2 | 5/2018 | Polizzi et al. |
| 10,475,493 B2 | 11/2019 | Sakai et al. |
| 2010/0067319 A1* | 3/2010 | Aipperspach .......... G11C 17/18 365/225.7 |
| 2022/0246182 A1* | 8/2022 | Wan .................... G11C 7/1096 |

* cited by examiner

| $V_{dd}$ | $V_{415}$ | $V_{425}$ | $V_{435}$ | $V_{445}$ | $V_{470}$ | $V_{460}$ | $V_{450}$ | Phase |
|---|---|---|---|---|---|---|---|---|
| 1.2 | 0 | 0 | 0 | 0 | 0 | 1.2 | 1.2 | Before HV-$V_{dd}$ rise for $V_{dd}$ |
| 1.2 | 0 | 0 | 1.2 | 0 | 1.2 | 1.2 | 1.2 | Lock before n_mid |
| 2.4 | 1.2 | 1.2 | 1.2 | 0 | 1.2 | 2.4 | 2.4 | High voltage |
| 1.2 | 0 | 0 | [1.2,0] 0 | 0 [1.2,0] | 1.2 | 1.2 | 1.2 | Return to $V_{dd}$ low, output high |
| 1.2 | 0 | 1.2 | 1.2 | 1.2 | 0 | 1.2 | 0 | Move to 0, lock p_mid |
| 2.4 | 2.4 | 1.2 | 1.2 | 1.2 | 0 | 1.2 | 0 | 0 when $V_{dd}$ is now high |
| 1.2 | [0,1.2] 1.2 | 1.2 [0,1.2] | 1.2 | 1.2 | 0 | 1.2 | 0 | Return to $V_{dd}$ low, output low |

FIG. 5

SILICON-ON-INSULATOR (SOI) CIRCUITRY FOR LOW-VOLTAGE MEMORY BIT-LINE AND WORD-LINE DECODERS

CROSS-REFERENCE TO RELATED APPLICATIONS

This application claims the benefit of U.S. Provisional Application No. 63/281,288 filed on Nov. 19, 2021, the contents of which are hereby incorporated by reference.

TECHNICAL FIELD

The present disclosure generally relates to circuits using filed-effect transistors (FETs) implemented on silicon-on-insulator (SOI), and more particularly to bit-line decoders and word-line drivers of memories implemented in SOI technologies.

BACKGROUND

In the implementation of memories, and in particular in memories which are non-volatile memories, for example, resistive random-access memories (ReRAMs), bit-line decoders and word-line drivers are used. Current bit-line decoders and word-line drivers are implemented using "high voltage" transistors. The term "high-voltage" provides a relative comparison to the "low voltage" used for other operations of the logic circuitry that make use of low-voltage transistors. Specifically, when referring to transistors herein, the reference is to field-effect transistors (FETs), which may include a variety of different implementations, such as, but not by way of limitation, planar FETs, FinFETs, metal-oxide semiconductor FETs (MOSFETs), and complementary MOSFETs (CMOSFETs).

FIG. 1A is an example of a bit-line decoder 100 that comprises of NMOS transistors 110 and 130 and PMOS transistors 120 and 140. In order to properly function, these transistors are high-voltage devices which can withstand the high voltages applied during the desired operations on the memory array. In this particular case, bit-line 0 (BL0) 150, is controlled by the select lines (SEL0) 112 and its inverse (SEL0B) (designated as SEL0 with an over-bar in FIG. 1) 122. Similarly, bit line 1 (BL1) 160, is controlled by the select lines (SEL1) 132 and its inverse (SEL1B) (designated as SEL1 with an over-bar in FIG. 1) 142. The Vhigh_Vlow 170 provides the necessary high voltage to the BL0 150 or BL1 160 based on the select circuitry. For example, as shown in FIG. 1B, if bit-line 1 (BL1) 160 is selected then SEL0 112 is at 0V, SEL0B 122 at 2.4V, SEL1 132 at 2.4V and SEL1B 142 at 0V. If the required transfer is a high-voltage then Vhigh_Vlow 170 is set to 2.4V. The result is BL0 150 at 0V and BL1 160 at 2.4V. FIG. 1C shows another example, for the same selection, if BL1 160 is to be kept float at 0V, then Vhigh_Vlow 170 is set at 0V, all other inputs remain the same, and both BL0 150 (floating) and BL1 160 will be at 0V (conducting). However, for this to be operative it is necessary to use high-voltage MOS transistors as the transistors need to be exposed to a high voltage which requires a transistor design that can withstand the additional stress.

It has been identified that such high-voltage transistors require a larger area, when compared to low-voltage transistors due to the required longer length, L. For example, a low voltage transistor may be operative at 1.2V while the high voltage transistor may be operative at 2.4V. The larger L impacts the overall area of the periphery circuitry of the memory, namely, the areas of the bit-line decoders and the world-line drivers is larger. The larger area does not only accrue additional costs for the real-estate used but also has an impact on the yield that reduces exponentially with the device's area. Furthermore, a higher voltage and a higher capacitive load, due to the transistor being larger, means that the power consumption of the high-voltage transistors is higher. However, using low-voltage transistors instead of the high-voltage transistor in the same circuitry would cause the low-voltage transistors to operate outside of their designated safe operating area (SOA) that may result in structural damage to the low-voltage transistors when high-voltage is applied thereto.

In view of such shortcomings, it would be advantageous to provide a solution that reduces the area of the peripheral circuitry of memory devices without changing the overall architecture of such memories. It would be further advantageous to provide a solution to overcome the challenges noted above in circuits implemented in SOI.

SUMMARY

A summary of several example embodiments of the disclosure follows. This summary is provided for the convenience of the reader to provide a basic understanding of such embodiments and does not wholly define the breadth of the disclosure. This summary is not an extensive overview of all contemplated embodiments, and is intended to neither identify key or critical elements of all embodiments nor to delineate the scope of any or all aspects. Its sole purpose is to present some concepts of one or more embodiments in a simplified form as a prelude to the more detailed description that is presented later. For convenience, the term "some embodiments" or "certain embodiments" may be used herein to refer to a single embodiment or multiple embodiments of the disclosure.

Certain embodiments disclosed herein include a memory. The memory comprises: a memory array having a plurality of bit-line inputs and a plurality of word-line inputs; a bit-line decoder having a plurality of bit-line outputs each bit-line output communicatively connected to a corresponding bit-line input of the memory array, wherein the bit-line decoder comprises a plurality of bit-line voltage supply circuits, wherein each bit-line voltage supply circuit comprises a first circuit comprising a first low-voltage field effect transistor (FET) of a first conductivity type connected in series with at least one second low-voltage FET of the first conductivity type and a second circuit comprising of a third low-voltage FET of a second conductivity type connected in series with at least one fourth low-voltage FET of the second conductivity type, wherein the first circuit is connected to the bit-line output and to a high-voltage supply input, and wherein the second circuit is connected to the bit-line output and to a high-voltage supply input; and a control circuit having a plurality of control lines, the control circuit adapted to provide control signals to at least one of: the first low-voltage FET, the at least one second low-voltage FET, the third low-voltage FET, and the at least one fourth low-voltage FET, wherein the control circuit provides the control signals in a sequence of a pre-pulse phase, a pulse phase, and a post-pulse phase, wherein at the pulse phase, the first circuit and the second circuit receives a desired voltage at the high-voltage supply input.

Certain embodiments disclosed herein also include a bit-line decoder having a plurality of bit-line outputs. The bit-line decoder comprises: a plurality of bit-line voltage supply circuits, wherein each bit-line voltage supply circuit comprises a first circuit comprising a first low-voltage field effect transistor (FET) of a first conductivity type connected in series with at least one second low-voltage FET of the first conductivity type and a second circuit comprising of a third low-voltage FET of a second conductivity type connected in series with at least one fourth low-voltage FET of the second conductivity type, wherein the first circuit is connected to the bit-line output and to a high-voltage supply input, and wherein the second circuit is connected to the bit-line output and to the high-voltage supply input.

Certain embodiments disclosed herein also include a ladder inverter adapted to operate as a word-line select. The ladder inverter comprises: a first low voltage (LV) field effect transistor (FET) of a first conductivity type having its source node connected to a power supply node and having a gate node being a first control input; a second LV FET of the first conductivity type having its source node connected to a drain node of the first LV FET and having a gate node being a second control input; a third LV FET of a second conductivity type having its drain node connected to a drain node of the second LV FET and having a gate node being a third control input; a fourth LV FET of the second conductivity type having its drain node connected to a source node of the third LV FET, having a gate node being a fourth control input, and further having a source node connected to ground; and an output node connected to the drain node of the second LV FET and the drain node of the third LV FET; wherein the ladder inverter is adapted to be controlled by a control circuit that provides control signals to the first control input, the second control input, the third control input, and the fourth control input, to provide a high-voltage at the output node of the ladder inverter while the first LV FET, the second LV MOSEFT, the third LV FET, and the fourth LV FET operate within designated LV safe operating areas (SOAs).

BRIEF DESCRIPTION OF THE DRAWINGS

The subject matter disclosed herein is particularly pointed out and distinctly claimed in the claims at the conclusion of the specification. The foregoing and other objects, features, and advantages of the disclosed embodiments will be apparent from the following detailed description taken in conjunction with the accompanying drawings.

FIG. 5 is a table of the phases of voltages at inputs of the inverter ladder according to an embodiment.

DETAILED DESCRIPTION

Figure 1A:
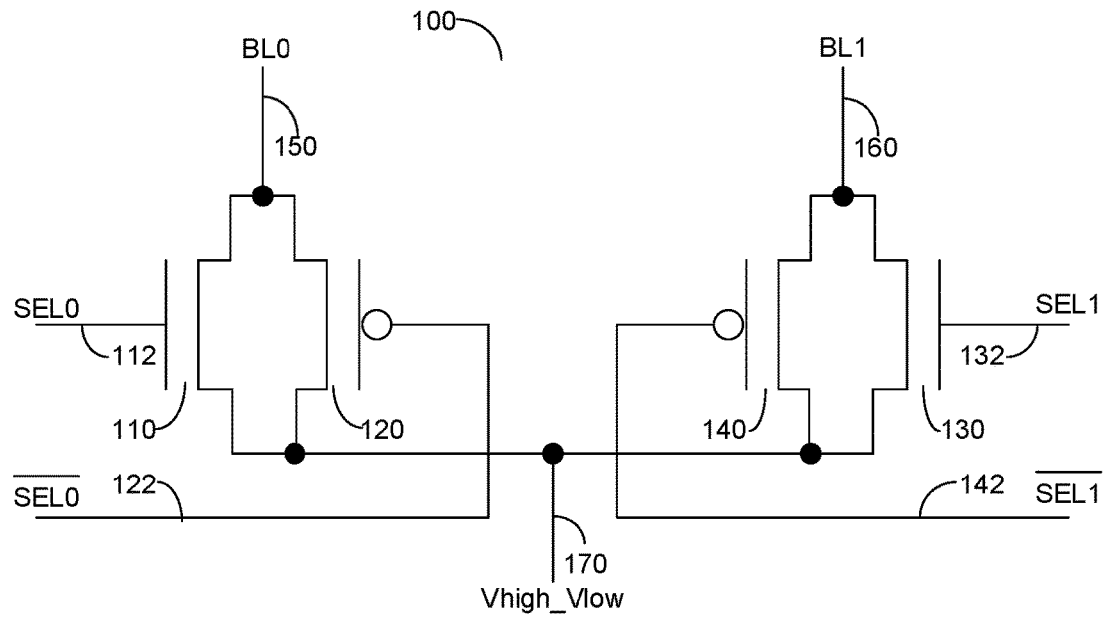
FIG. 1A is schematic diagram of a conventional bit-line decoder.
Figure 1B:
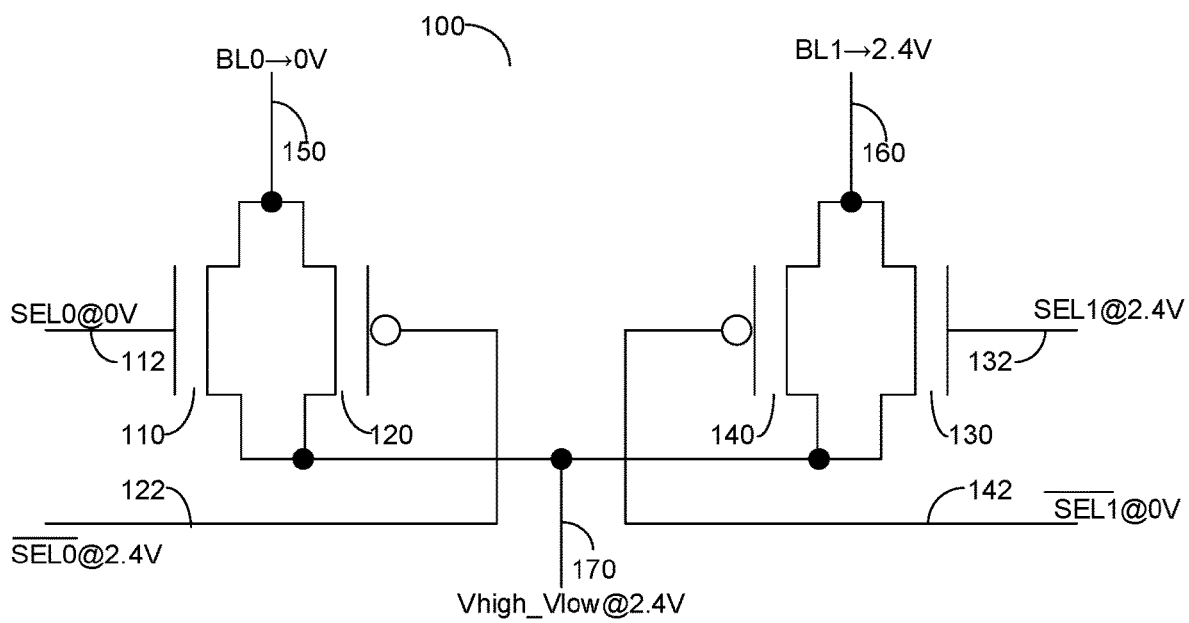
FIG. 1B is the conventional bit-line decoder demonstrating voltages when selecting bit-line 1 to provide high-voltage to the selected bit-line.
Figure 1C:
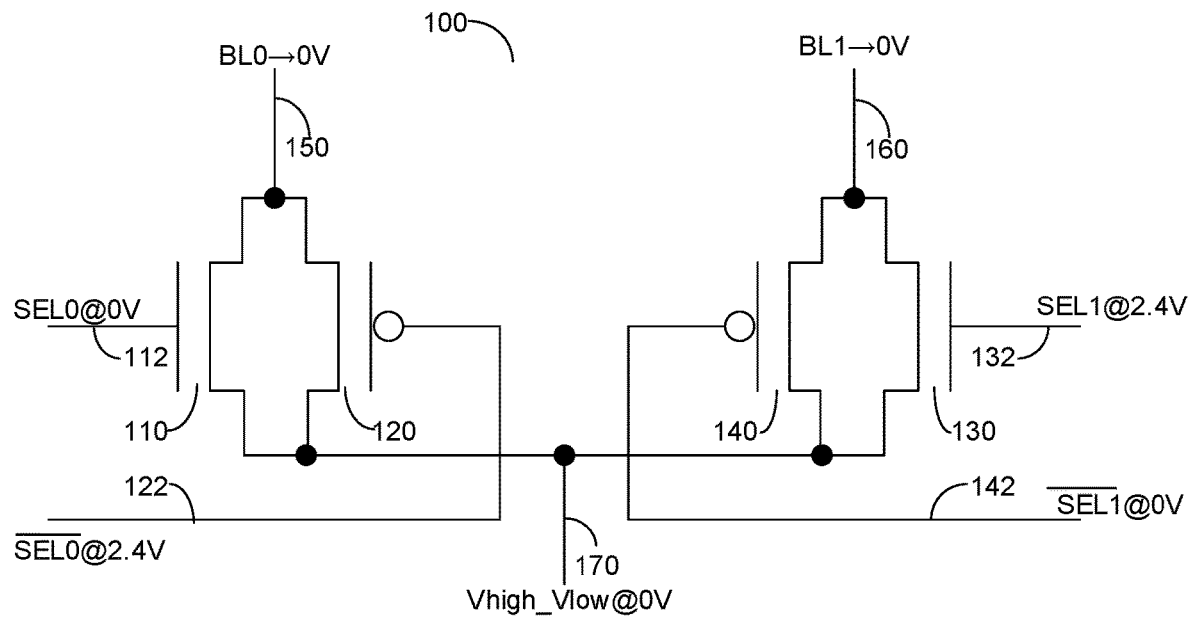
FIG. 1C is the conventional bit-line decoder demonstrating voltages when selecting bit-line 1 to provide low-voltage to the selected bit-line.

It is important to note that the embodiments disclosed herein are only examples of the many advantageous uses of the innovative teachings herein. In general, statements made in the specification of the present application do not necessarily limit any of the various claimed embodiments. Moreover, some statements may apply to some inventive features but not to others. In general, unless otherwise indicated, singular elements may be in plural and vice versa with no loss of generality. In the drawings, like numerals refer to like parts through several views.

The term "NFET" refers to an n-channel, or n-type, field-effect transistor (FET). The term "PFET" refers to a p-channel, or p-type, FET. Specifically, when referring to transistors or FETs, these may include a variety of different implementations, such as, but not by way of limitation, planar FETs, FinFETs, metal-oxide semiconductor FETs (MOSFETs), and complementary MOSFETs (CMOSFETs). The term low-voltage refers herein to the normal operational voltage of a FET in a given technology node, for example 1.2V. The term high-voltage refers herein to an operational voltage of a FET in a given technology node that is higher than the normal operation voltage, for example 2.4V, and which typically requires a different design of the transistor, for example, increasing the channel length L. For example, but not by way of limitation, a 1.8V FET is 0.35 μm in length, and 1.2V FET is easily 90 nm. This would mean that two minimal "L" low-voltage FETs are shorter than one high voltage FET. It should be further appreciated that the high-voltage may be compared to the low-voltage in absolute values.

The various disclosed embodiments provide periphery circuits for memory, particularly non-volatile memory (NVM), such as resistive random-access memory (Re-RAM), using low-voltage field-effect transistors (FETs). Low-voltage FETs are used in the bit-line and word-line decoders, in the silicon on insulator (SOI) technologies to reduce the area of the periphery circuits of the memory array without requiring change to the memory array itself. Specifically, instead of using a single high-voltage FET, for example a FET withstanding 2.4V, two low-voltage FETs, for example a FET withstanding 1.2V, are used. A process of pre-pulse stage and a post-pulse stage are employed to ensure low voltage on the low-voltage FETs while employing a pulse-stage in between to supply the high voltage for proper decoding to take place without damaging the low-voltage FETs. Hence, the operating principle, of the disclosed embodiments, ensures that the source, drain, and gate of each low-voltage FET do not exceed their respective safe operating area (SOA).

Figure 2:
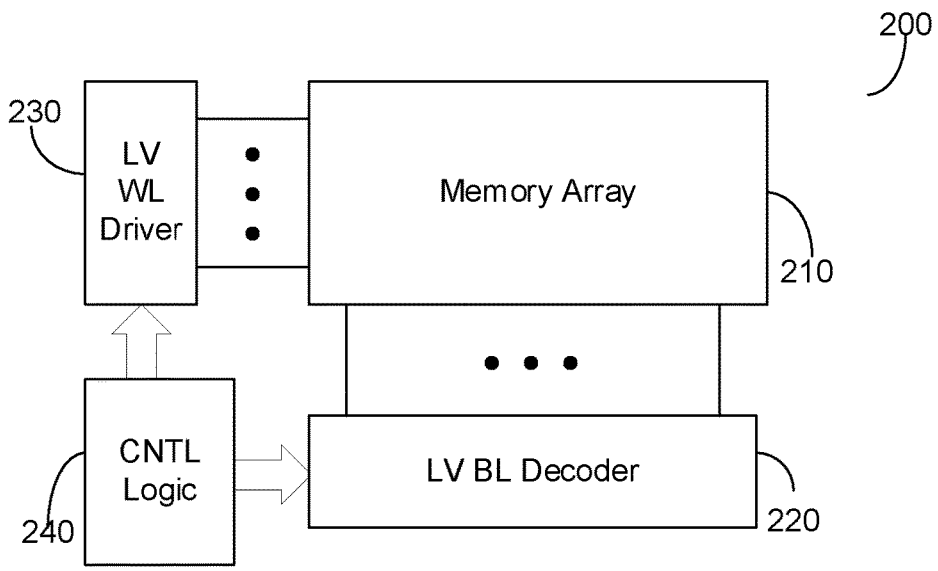
FIG. 2 is a schematic diagram of a memory using low-voltage transistors in at least its bit-line decoders or its word-line drivers according to an embodiment.

FIG. 2 is an example schematic diagram of a memory 200 using low-voltage transistors in at least one of its bit-line decoders and its word-line drivers according to an embodiment. In a SOI memory, advantage is taken of the fact that the maximal voltage conditions of the bulks are more relaxed in SOI which allows for a more cost-effective solution, as shown herein, for bit-line decoders, word-line drivers, and other high-voltage logic using FETs, and in particular in NVM designs. Moreover, such configuration of the memory provides advantages in area, as the periphery, e.g., low-voltage word-line drivers 230 and low-voltage bit-line decoders 220, of the memory array 210, that may utilize two, or more, lower "L" FETs, instead of long length FETs, i.e., high-voltage transistors, thereby saving area. Another advantage is that when driving the low-voltage FETs in read mode, a maximal available over-drive is achieved, and therefore there is no need to use a charge-pump or high voltage for the decoding, to be provided by the control logic 240, unlike the case where high-voltage transistors are used.

In an embodiment, the changes are in the periphery circuitry, i.e., the control logic 240, the low-voltage word-line drivers 230, and the low-voltage bit-line decoder 220, without changes in the memory array 210. It should be noted that the description herein refers to low-voltage transistors as being able to handle 1.2V and high-voltage transistors as being able to withstand 2.4V, however, this should not be viewed as limiting upon the present disclosure. One of ordinary skill in the art would readily appreciate that, in a given technology, there are designs for low-voltage FETs and high-voltage transistors, where the high-voltage FETs withstand a higher-voltage applied thereon at the price of a large L.

According to the disclosed embodiments, operation of the configured memory involves a pre-pulse stage, a pulse stage, and a post pulse stage. In the pre-pulse stage and the post-pulse stage, the intermediate stages' voltages are built up in order to make sure that the source, drain, and gate voltages are within the safe operating area (SOA) of the low-voltage transistors as the bulk is floating. In an example embodiment, the reference is 1.2V. In the pulse stage, when the change of voltages actually happens, a high-voltage is provided as input to the bit-line as explained herein with greater detail. In an embodiment, the SOA of the low-voltage transistors is a first SOA and the SOA of the high-voltage transistors is a second SOA.

Figure 3A:
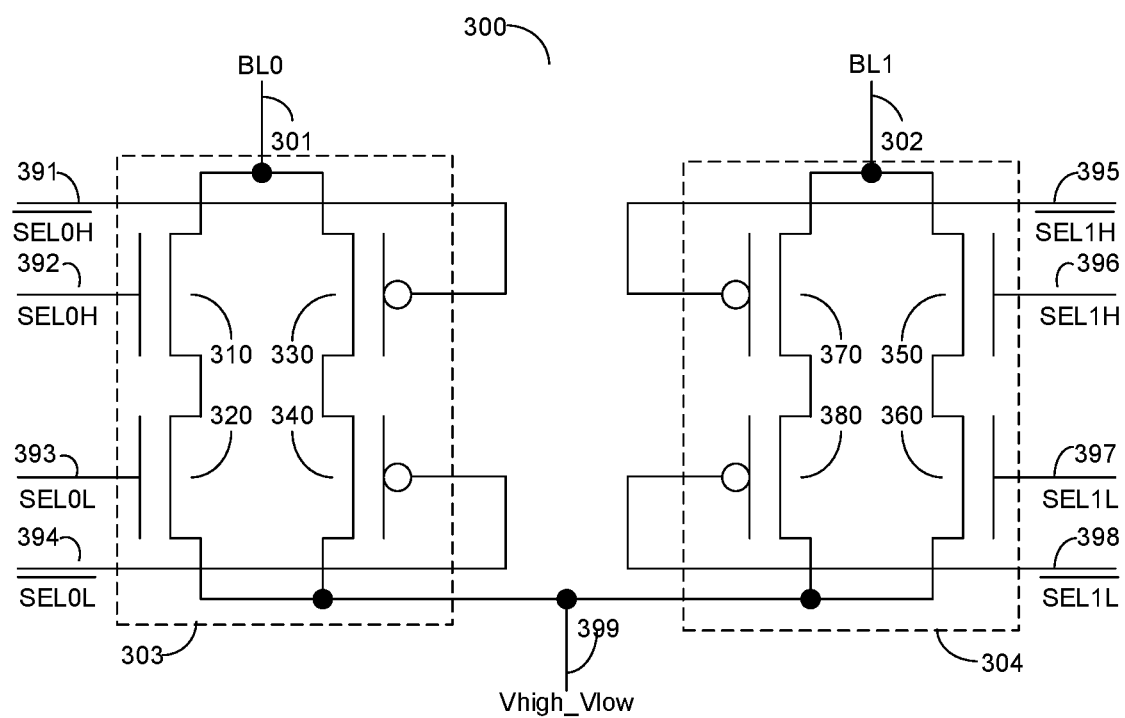
FIG. 3A is a bit-line decoder using low-voltage transistors according to an embodiment.

FIG. 3A is an example bit-line decoder 300 using low-voltage transistors according to an embodiment. The bit-line decoder 300 drives bit-lines BL0 301 and BL1 302. Each of the bit-lines 301 and 302 are connected to a voltage supply circuit (303 and 304 in FIG. 3A) that connects each respective bit-line 301 and 302 to a supply voltage Vhigh_Vlow 399. The Vhigh_Vlow 399 supplies set/reset voltages, for the programming of, for example a ReRAM cell. The voltage supply circuit 303 includes two NFETs 310 and 320 connected in series between BL0 301 and Vhigh_Vlow 399. The voltage supply circuit 303 further includes two PFETs 330 and 340 connected in series between BL0 301 and Vhigh_Vlow 399. The supply circuit 304 is similarly connected with NFET transistors 350 and 360 and PFETs 370 and 380 connecting Vhigh_Vlow 399 to BL1 302. The supply circuit 303 is operative under select control signals 391, 392, 393, and 394, while supply circuit 304 is operative under select control signals 395, 396, 397, and 398.

It should be noted that inverted input pins for the respective select control signals are indicated using the letter "B" in the specification and shown as an over-bar in the respective figure, hereinafter. For example, the signal SLE0HB 391, shown as SLE0H with an over-bar in FIG. 3A, is the inverted high-voltage input pin to select BL0. The signal SLE0H 392 is the high-voltage input pin to select BL0. The signal SEL0L 393 is the low-voltage input pin to select BL0. The signal SEL0LB 394 is the inverted low-voltage input pin to select BL0. The signal SEL1HB 395 is the inverted high-voltage input pin to select BL1. The signal SEL1H 396 is the high-voltage input pin to select BL1. The signal SEL1L 397 is the low-voltage input pin to select BL1. The signal SEL1LB 398 is the inverted low-voltage input pin to select BL1. In the following figures, operation of the circuit is shown where the assumptions are that BL0 301 and BL1 302 were discharged to 0, and that BL0 301 remains floating at 0, in both cases. In such case, the BL0 does not conduct current, including from the ReRAMs connected to it.

Figure 3B:
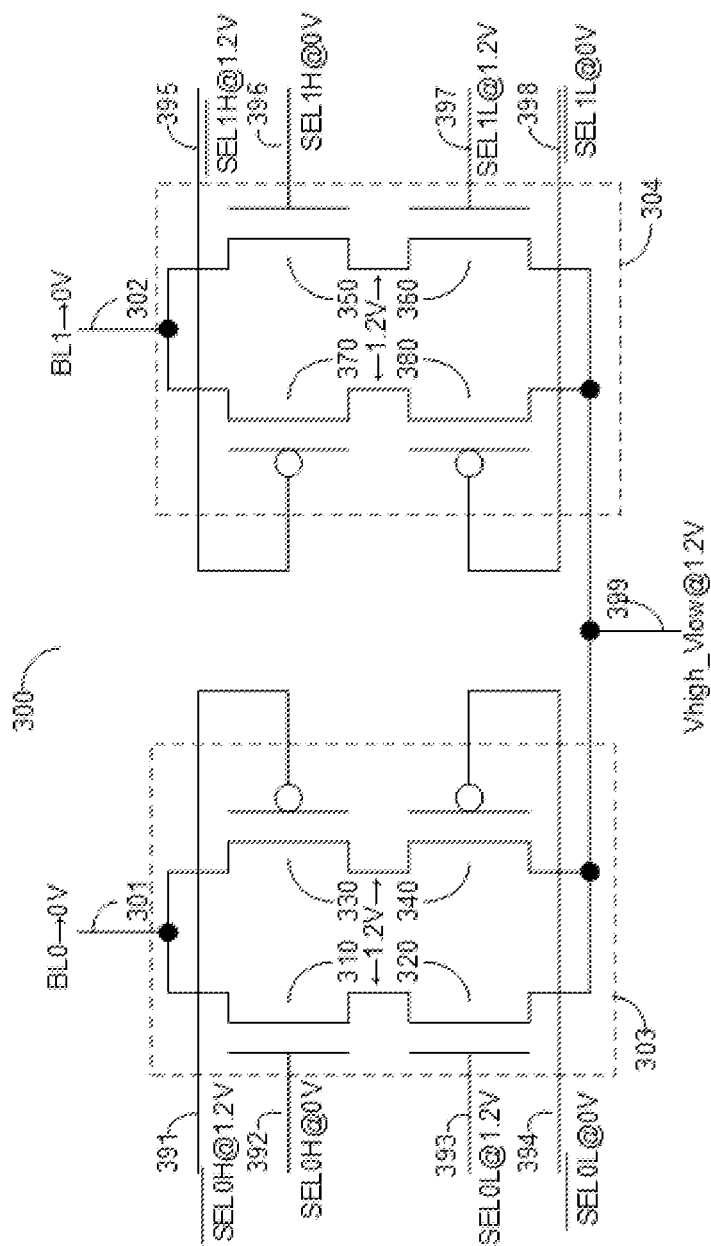
FIG. 3B is the bit-line decoder using low-voltage transistors showing pre-pulse phase voltages according to an embodiment.

In order to perform proper bit-line selection, a sequence of pre-pulse phase and post-pulse phase precede and succeed the pulse phase, respectively. FIG. 3B shows the voltages that are applied at particular nodes designated by the "@" symbol in a pre-pulse phase. For example, SEL0L@1.2V means that a 1.2V is applied at the gate 393 of NET 320, while SEL0HB@1.2V means that a 1.2V is applied at the gate 391 of the PFET 330. As a result of applying the shown voltages at the pre- and post-pulse phases, the voltage at BL0 is 0V, designated in FIG. 3B as BL0→0V, while the voltage at BL1 is 0V, designated in FIG. 3B as BL1→0V. The respective voltages, at the point where the drain and source of NFETs 310 and 320 connect is at 1.2V, point the drain and source of PFETs 330 and 340 connect is at 1.2V, point the drain and source of NFET transistors 350 and 360 connect is at 1.2V, and point the drain and source of PFET transistors 370 and 380 connect is at 1.2V. Therefore, in the pre- and post-pulse phases the low-voltage transistors 310, 320, 330, 340, 350, 360, 370, and 380 are all within their designated SOA. In an embodiment, a control logic (240, FIG. 2) provides proper sequence of voltages for the pre-pulse phase, the pulse phase, and the post-pulse phase.

Figure 3C:
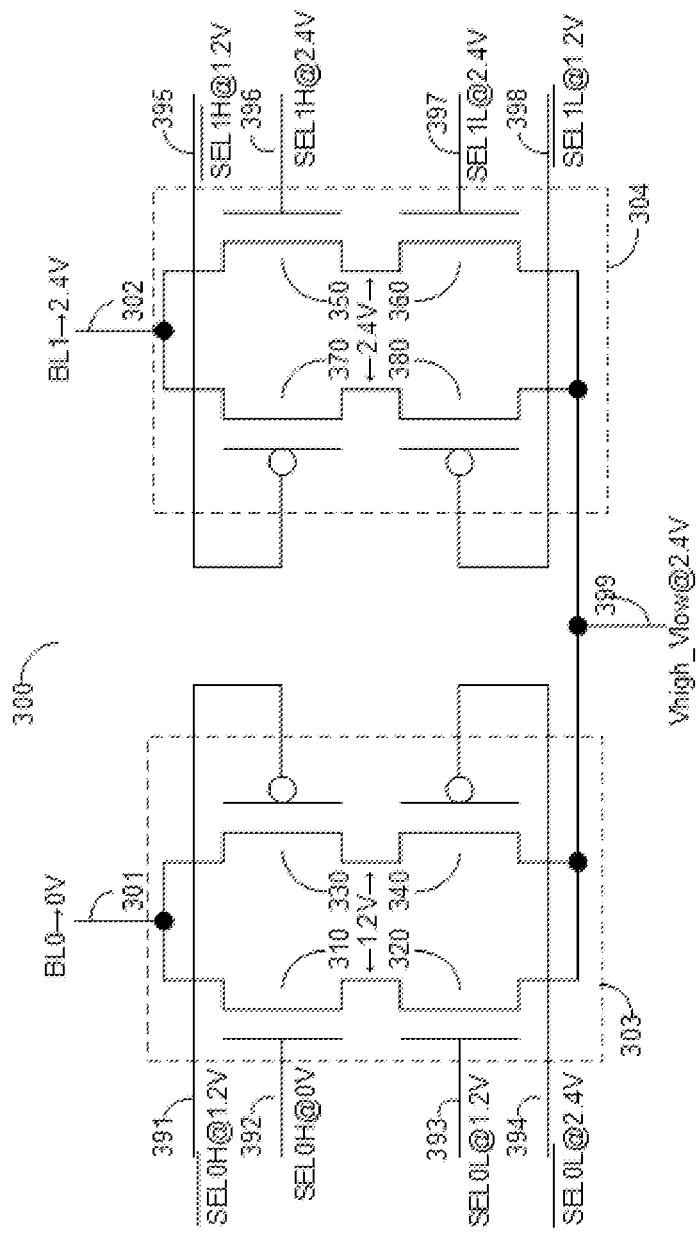
FIG. 3C is the bit-line decoder using low-voltage transistors showing pulse phase voltages for providing a high-voltage at bit-line 1 according to an embodiment.

In the pulse phase that occurs between the pre-pulse phase and post-pulse phase, a high-voltage may be presented to a bit-line. FIG. 3C is an example bit-line decoder 300 using low-voltage transistors showing pulse phase voltages for providing a high-voltage at BL1 according to an embodiment. FIG. 3C shows the voltages that are applied at particular nodes designated by the "@" symbol. For example, SEL1H@2.4V means that a 2.4V is applied at the gate 396 of NFET 350, while SEL0LB@2.4V means that a 2.4V is applied at the gate 394 of the PFET 340. The high-voltage pulse is supplied at the node Vhigh_Vlow 399 at 2.4V, shown in FIG. 3C as Vhigh_Vlow@2.4V. In an embodiment, the voltage supplied at the node Vhigh_Vlow 399 is a desired voltage.

In an example embodiment, by applying the shown voltages at pulse phase, the voltage at BL0 is 0V, designated in FIG. 3C as BL0→0V, while the voltage at BL1 is 2.4V, designated in FIG. 3C as BL1→2.4V. The voltages at the point where the drain and source of NFET transistors 310 and 320 connect is floating at 1.2V, point the drain and source of PFET transistors 330 and 340 connect is floating at 1.2V, point the drain and source of NFET transistors 350 and 360 connect is at 2.4V, and point the drain and source of PFET transistors 370 and 380 connect is at 2.4V. Therefore, as the bulk of the transistors' floats, in the pulse phase, the low-voltage transistors 310, 320, 330, 340, 350, 360, 370, and 380 are all within their designated SOA. It should be appreciated that the disclosed embodiments enable use of low-voltage transistors while providing high-voltage into the memory array bit-line. It is the task of the control logic 240 to provide the proper sequence of voltages for the pre-pulse phase, the pulse phase, and the post-pulse phase.

Figure 3D:
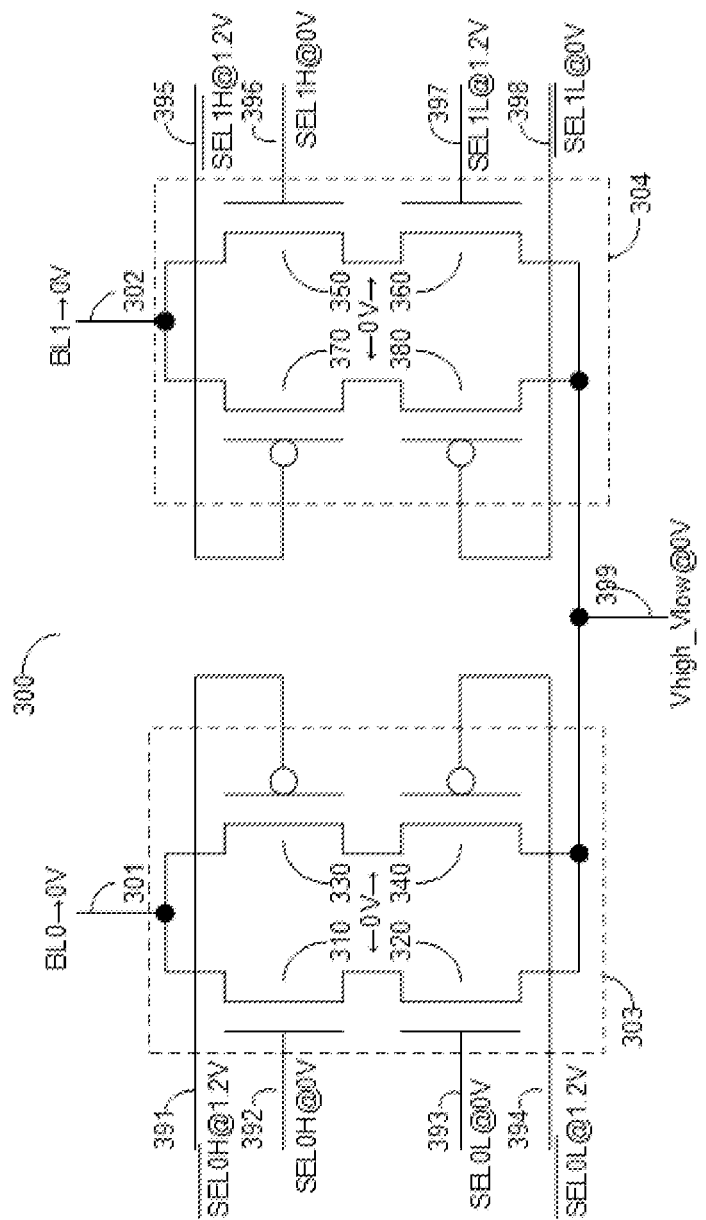
FIG. 3D is the bit-line decoder using low-voltage transistors showing pulse phase voltages for providing a low-voltage at bit-line 0 and bit-line 1 according to an embodiment.

FIG. 3D is an example bit-line decoder 300 using low-voltage transistors showing pulse phase voltages for providing a low-voltage at BL1 according to an embodiment. FIG. 3D shows the voltages that are applied at particular nodes designated by the "@" symbol. For example, SEL1H@1.2V means that a 1.2V is applied at the gate 396 of NFET 350, while SEL0LB@1.2V means that a 1.2V is applied at the gate 394 of the PFET 340. The low-voltage pulse is supplied at the node Vhigh_Vlow 399 at 0V, shown in FIG. 3D as Vhigh_Vlow@0V. In an embodiment, the voltage supplied at the node Vhigh_Vlow 399 is a desired voltage.

In an example embodiment, by applying the shown voltages at pulse phase, the voltage at BL0 is 0V, designated in FIG. 3D as BL0→0V, while the voltage at BL1 is 0V, designated in FIG. 3D as BL1→0V. The BL0 is floating at 0. The voltages at the point where the drain and source of NFET transistors 310 and 320 connect is floating at 0V, but can also be conducting at 0. The point at which the drain and source of PFET transistors 330 and 340 connect is floating at 0V, but can be also conducting 0. The point at which the drain and source of NFET transistors 350 and 360 connect is at 0V, and the point the drain and source of PFET transistors 370 and 380 connect is at 0V. Therefore, in the pulse phase the low-voltage transistors 310, 320, 330, 340, 350, 360, 370, and 380 are all within their designated SOA.

It should be appreciated that the disclosed embodiments enable the ability to use low-voltage transistors for providing high-voltage into the memory array bit-line. It is the task of the control logic 240 to provide the proper sequence of voltages for the pre-pulse phase, the pulse phase, and the post-pulse phase. One of ordinary skill in the art would therefore appreciate that any voltage value between [0V, 1.2V], for 393 and 394 would work, because, by design, paths that should conduct are open, while paths that should not conduct are closed, and therefore, the bit-line decoder according to the disclosed embodiments, do not suffer SOA violations. To this end, in an embodiment, a desired voltage is applied during the pulse phase.

Figure 3E:
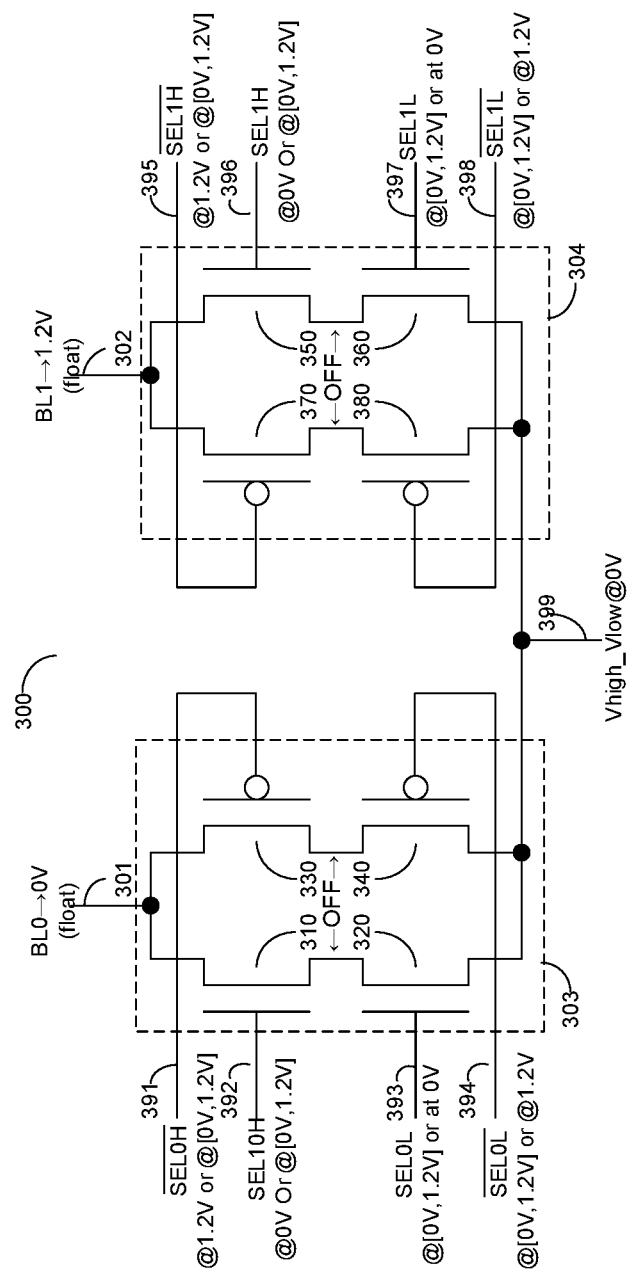
FIG. 3E is the bit-line decoder using low-voltage transistors showing post-pulse phase voltages for providing a low-voltage at bit-line 0 and bit-line 1 according to an embodiment.

FIG. 3E is an example bit-line decoder 300 using low-voltage transistors showing post-pulse phase according to an embodiment. In the example embodiment, both BL0 301 and BL1 302 remain non-conducting. SEL0L 393 is at 1.2V and works in the following manner: as long as at least one of the NFETs chain or the PFETs chain is OFF, BL1 302 shall be 1.2V (floating), BL0 301 is 0 (floating). In the example embodiment, one of SEL1H 396 and SEL1L 397 is at 0V, while the other can be at any value between [0V,1.2V]. One of SEL1HB 395 and SEL1LB 398 is at 1.2V, and the other can be of any value between [0V,1.2V]. One of SEL0L 392 and SEL0L 393 is at 0V, while the other can be at any value between [0V,1.2V]. One of SEL0HB 391 and SEL0LB 394 is at 1.2V, while the other can be at any value between [0V,1.2V].

Figure 4:
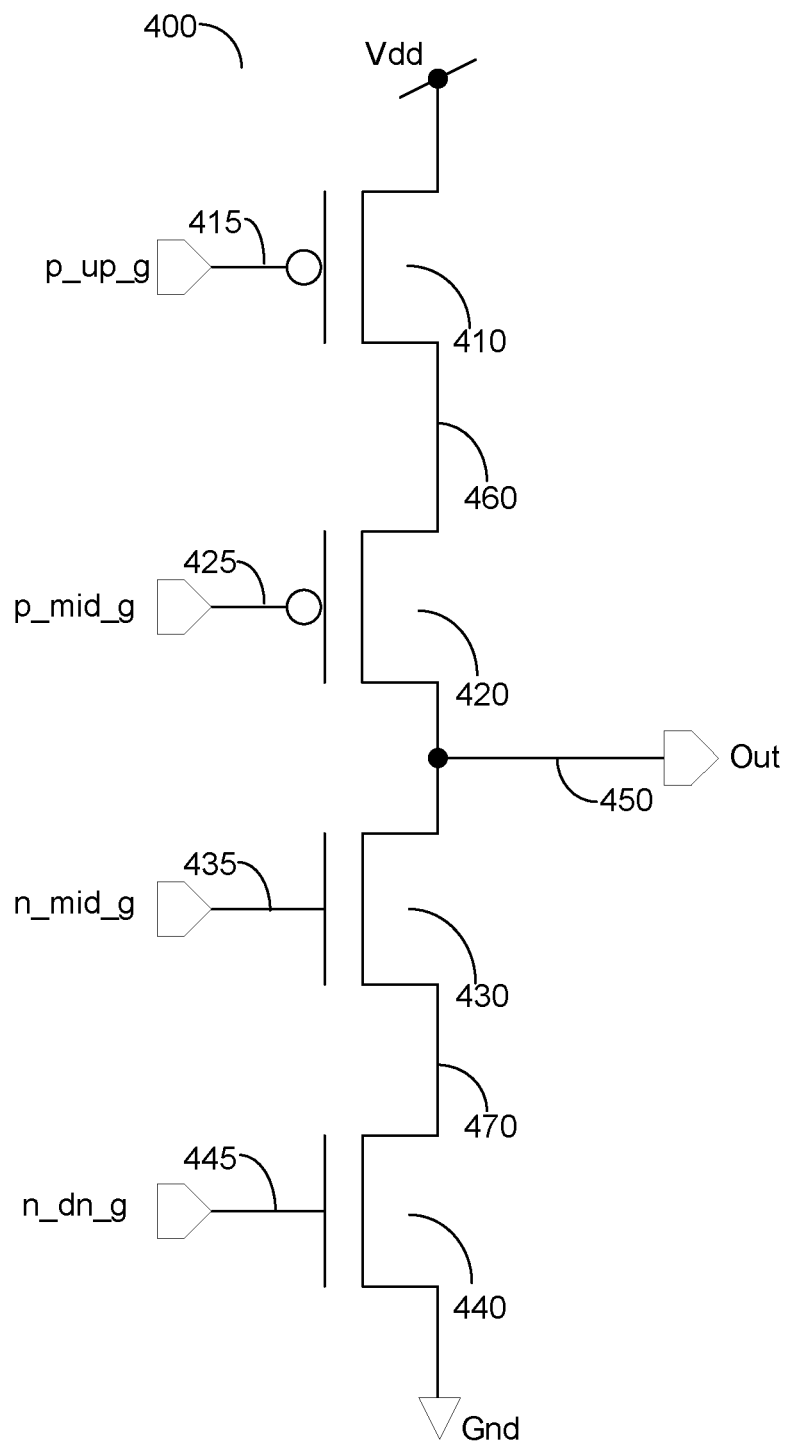
FIG. 4 is an inverter ladder of low-voltage transistors for providing high-voltage drive according to an embodiment.

FIG. 4 is an example inverter ladder 400 of low-voltage transistors for providing high-voltage drive according to an embodiment. In an embodiment, the inverter ladder 400, when controlled as explained herein, performs as a word-line driver and for driving of a column select. A source of a first PMOS 410 is connected to Vdd. According to an embodiment, and as further explained herein, Vdd may have a low-voltage, for example, 1.2V, or a high voltage, for example 2.4V. To the drain of PMOS 410 the source of a second PMOS 420 is connected (node 460), the drain of which is connected to the output 450, used for the select signal. To the drain of PMOS 420 there is connected the drain of NMOS 430, which is also connected to the output signal 450. The source of the NMOS 430 is connected the drain of NMOS 440 (node 470), and the source of the NMOS 440 is connected to a ground (Gnd). The operation of the inverter ladder 400 is controlled by providing appropriate voltages to the input signal p_up_g 415, p_mid_g 425, n_mid_g 435, and n_dn_g 445.

As noted with respect to the operation of the decoder circuitry 300 described herein, the operation of the inverter ladder 400 is performed such that the low-voltage transistors 410, 420, 430, and 440 is always within their SOA. That is, at no time the operational voltage may exceed 1.2V and therefore, according to the disclosed embodiments, a certain sequence of phases is performed for operation at 2.4V.

FIG. 5 is an example table of the phases of voltages at inputs of an inverter ladder according to an embodiment. The nodes referred to herein in FIG. 5 are respective nodes in the example inverter ladder 400, FIG. 4. The table in FIG. 5 describes the voltages applied at the nodes $V_{dd}$, $V_{415}$, $V_{425}$, $V_{435}$, and $V_{445}$. It further describes the resultant voltages at nodes $V_{470}$, $V_{460}$, and the output voltage $V_{450}$. Each line of the table described in FIG. 5, is a phase in the operation in order to reach a high-voltage, for example 2.4V, while maintaining each of the transistors 410, 420, 430, and 440 within their low-voltage SOA. In an embodiment, the phases are performed in the listed order to prevent any one of the transistors 410, 420, 430, and 440 to be subjected to excess voltage. To this end, the disclosed embodiments allow smaller transistors to be used. It should be appreciated that the low-voltage transistors having a shorter length L than high-voltage transistors provide benefits of smaller periphery circuitry area.

It should be noted that in the phase return to Vdd low, output high (4$^{th}$ line of the table) the voltages at $V_{435}$ and $V_{445}$ are such at that at least one of them is at 0V, the other may be at 0V or 1.2V. That is, when voltage at $V_{435}$ is at 0V, the voltage at $V_{445}$ is any one of 0V and 1.2V. A similar case is in the phase return to Vdd low, output low (last line of the table) where at least one of $V_{415}$ and $V_{425}$ must be at 1.2V, while the other node can be at 0V or 1.2V. Such configuration prevents rush currents that could be present.

All examples and conditional language recited herein are intended for pedagogical purposes to aid the reader in understanding the principles of the disclosed embodiment and the concepts contributed by the inventor to furthering the art and are to be construed as being without limitation to such specifically recited examples and conditions. Moreover, all statements herein reciting principles, aspects, and embodiments of the disclosed embodiments, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

It should be understood that any reference to an element herein using a designation such as "first," "second," and so forth does not generally limit the quantity or order of those elements. Rather, these designations are generally used herein as a convenient method of distinguishing between two or more elements or instances of an element. Thus, a reference to first and second elements does not mean that only two elements may be employed there or that the first element must precede the second element in some manner. Also, unless stated otherwise, a set of elements comprises one or more elements.

As used herein, the phrase "at least one of" followed by a listing of items means that any of the listed items can be utilized individually, or any combination of two or more of the listed items can be utilized. For example, if a system is described as including "at least one of A, B, and C," the system can include A alone; B alone; C alone; 2A; 2B; 2C;

3A; A and B in combination; B and C in combination; A and C in combination; A, B, and C in combination; 2A and C in combination; A, 3B, and 2C in combination; and the like.

What is claimed is:

1. A memory comprises:
   a memory array having a plurality of bit-line inputs and a plurality of word-line inputs;
   a bit-line decoder having a plurality of bit-line outputs each bit-line output communicatively connected to a corresponding bit-line input of the memory array, wherein the bit-line decoder comprises a plurality of bit-line voltage supply circuits, wherein each bit-line voltage supply circuit comprises a first circuit comprising a first low-voltage field effect transistor (FET) of a first conductivity type connected in series with at least one second low-voltage FET of the first conductivity type and a second circuit comprising of a third low-voltage FET of a second conductivity type connected in series with at least one fourth low-voltage FET of the second conductivity type, wherein the first circuit is connected to the bit-line output and to a high-voltage supply input, and wherein the second circuit is connected to the bit-line output and to a high-voltage supply input; and
   a control circuit having a plurality of control lines, the control circuit adapted to provide control signals to at least one of: the first low-voltage FET, the at least one second low-voltage FET, the third low-voltage FET, and the at least one fourth low-voltage FET, wherein the control circuit provides the control signals in a sequence of a pre-pulse phase, a pulse phase, and a post-pulse phase, wherein at the pulse phase, the first circuit and the second circuit receives a desired voltage at the high-voltage supply input.

2. The memory of claim 1, wherein at the pre-pulse and the post-pulse phase, the first low-voltage FET, the at least one second low-voltage FET, the third FET, and the at least one fourth low-voltage FET, each receives a voltage no greater than a low-voltage.

3. The memory of claim 1, wherein a low-voltage FET has a first safe operating area (SOA) and a high-voltage FET has a second SOA, wherein an absolute value of a low-voltage is smaller than an absolute value of a high-voltage.

4. The memory of claim 1, wherein the first conductivity type is an N-type and the second conductivity type is a P-type.

5. The memory of claim 1, wherein the high-voltage supply input receives at least one of: 0V and a high-voltage.

6. The memory of claim 1, further comprising:
   a word-line driver having a plurality of word-line outputs connected to corresponding word-line inputs of the plurality of word-line inputs of the memory array.

7. The memory of claim 6, wherein the word-line driver further comprises:
   at least a ladder inverter comprising a plurality of low-voltage FETs connected in series, wherein the at least a ladder inverter is controlled by the control circuit to provide a high-voltage at an output of the at least a ladder inverter connected to a word-line inputs of the plurality of word-line inputs, wherein the plurality of low-voltage FETs operate within a designated first SOA.

8. The memory of claim 1, wherein the memory array is a non-volatile memory (NVM).

9. The memory of claim 8, wherein the NVM is a resistive random-access memory (ReRAM).

10. The memory of claim 1, wherein the FET is one of: a planar FET, a FinFET, and a metal-oxide semiconductor FET (MOSFET).

11. A bit-line decoder having a plurality of bit-line outputs, the bit-line decoder comprises:
    a plurality of bit-line voltage supply circuits, wherein each bit-line voltage supply circuit comprises a first circuit comprising a first low-voltage field effect transistor (FET) of a first conductivity type connected in series with at least one second low-voltage FET of the first conductivity type and a second circuit comprising of a third low-voltage FET of a second conductivity type connected in series with at least one fourth low-voltage FET of the second conductivity type, wherein the first circuit is connected to the bit-line output and to a high-voltage supply input, and wherein the second circuit is connected to the bit-line output and to the high-voltage supply input.

12. The bit-line decoder of claim 11, wherein the first conductivity type is an N-type and the second conductivity type is a P-type.

13. The bit-line decoder of claim 11, wherein the high-voltage supply input receives at least one of: 0V and the high voltage.

14. The bit-line decoder of claim 11, wherein the FET is one of: a planar FET, a FinFET, and a metal-oxide semiconductor FET (MOSFET).

15. A ladder inverter adapted to operate as a word-line select comprises:
    a first low voltage (LV) field effect transistor (FET) of a first conductivity type having its source node connected to a power supply node and having a gate node being a first control input;
    a second LV FET of the first conductivity type having its source node connected to a drain node of the first LV FET and having a gate node being a second control input;
    a third LV FET of a second conductivity type having its drain node connected to a drain node of the second LV FET and having a gate node being a third control input;
    a fourth LV FET of the second conductivity type having its drain node connected to a source node of the third LV FET, having a gate node being a fourth control input, and further having a source node connected to ground; and
    an output node connected to the drain node of the second LV FET and the drain node of the third LV FET;
    wherein the ladder inverter is adapted to be controlled by a control circuit that provides control signals to the first control input, the second control input, the third control input, and the fourth control input, to provide a high-voltage at the output node of the ladder inverter while the first LV FET, the second LV FET, the third LV FET, and the fourth LV FET operate within designated LV safe operating areas (SOAs).

16. The ladder inverter of claim 15, wherein the first conductivity type is an N-type and the second conductivity type is a P-type.

17. The ladder inverter of claim 15, wherein the power supply is any one of: low-voltages and high-voltages, wherein absolute values of the high-voltages are higher than absolute values of the low-voltages.

18. The ladder inverter of claim 15, wherein the FET is any one of: a planar FET, a FinFET, and a metal-oxide semiconductor FET (MOSFET).

* * * * *